(12) United States Patent
Oppermann et al.

(10) Patent No.: US 8,673,773 B2
(45) Date of Patent: *Mar. 18, 2014

(54) METHOD FOR PRODUCING A NANOPOROUS LAYER

(75) Inventors: Hermann Oppermann, Berlin (DE); Lothar Dietrich, Werder (DE); Gunter Engelmann, Berlin (DE); Wolf Jürgen, Berlin (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 495 days.

This patent is subject to a terminal disclaimer.

(21) Appl. No.: 12/743,009

(22) PCT Filed: Nov. 14, 2008

(86) PCT No.: PCT/EP2008/009830
§ 371 (c)(1),
(2), (4) Date: Sep. 7, 2010

(87) PCT Pub. No.: WO2009/062754
PCT Pub. Date: May 22, 2009

(65) Prior Publication Data
US 2010/0323518 A1    Dec. 23, 2010

(30) Foreign Application Priority Data

Nov. 14, 2007   (DE) .................. 10 2007 055 019

(51) Int. Cl.
*H01L 21/4763*   (2006.01)

(52) U.S. Cl.
USPC ........... 438/654; 438/107; 438/479; 438/686; 257/739; 257/741; 257/678; 257/E21.584

(58) Field of Classification Search
USPC .......... 438/107, 479, 654, 686; 257/739, 741, 257/678, 788–795, E21.584; 623/901
See application file for complete search history.

(56) References Cited

U.S. PATENT DOCUMENTS

| 3,097,149 A | 7/1963 | Lacroix |
| 2002/0127327 A1 | 9/2002 | Schwarz et al. |
| 2004/0040416 A1 | 3/2004 | Erlebacher et al. |
| 2004/0148015 A1 | 7/2004 | Lye et al. |

(Continued)

FOREIGN PATENT DOCUMENTS

| EP | 0392738 A1 | 10/1990 |
| JP | 9-153519 | * 6/1997 |
| JP | 2007277613 A | 10/2007 |
| WO | WO-2004/020064 A2 | 3/2004 |

OTHER PUBLICATIONS

"Application No. 2007-852958, Database WPI Week 200779, Thomson Scientific, London, GB", 2 pgs.

(Continued)

*Primary Examiner* — Mark A Laurenzi
(74) *Attorney, Agent, or Firm* — Schwegman Lundberg & Woessner, P.A.

(57) ABSTRACT

A method for producing a nanoporous layer comprises applying a plating base with adhesion strengthening onto a substrate, depositing a layer made of gold and silver onto the substrate, the composition being in the range of 20% to 40% gold and 80% to 60% silver, and selectively removing the silver in order to produce a nanoporous gold layer.

18 Claims, 5 Drawing Sheets

(56) References Cited

U.S. PATENT DOCUMENTS

Figure 1:
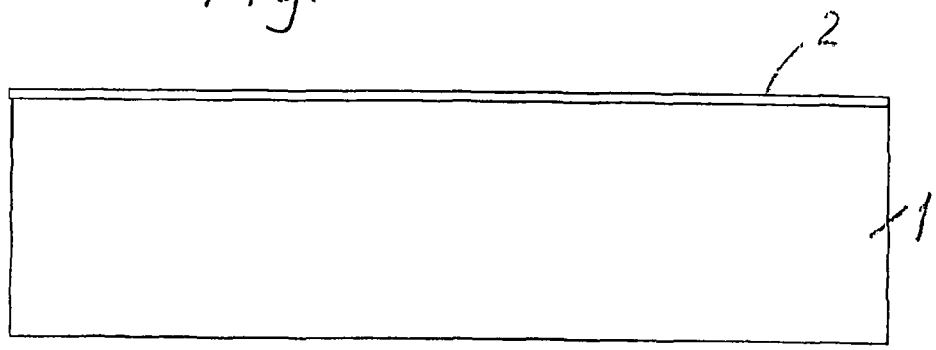
Figure 1:
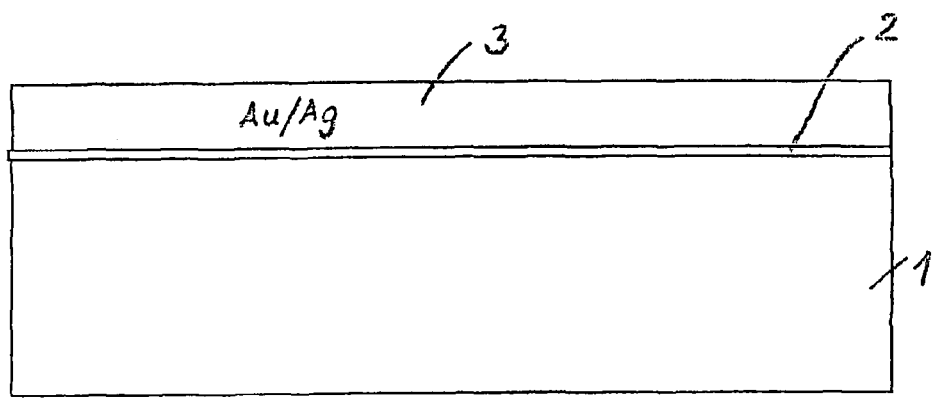
Figure 1:
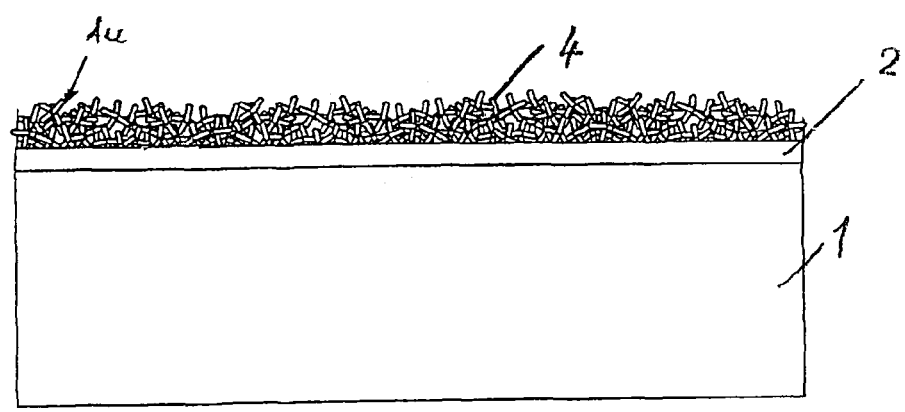

| | | | |
|---|---|---|---|
| 2006/0193890 A1* | 8/2006 | Owens et al. | 424/423 |
| 2006/0274470 A1 | 12/2006 | Srinivasan et al. | |
| 2007/0224099 A1* | 9/2007 | Biener et al. | 423/247 |
| 2007/0275503 A1 | 11/2007 | Lin et al. | |
| 2010/0307804 A1 | 12/2010 | Oppermann | |

OTHER PUBLICATIONS

"International Application No. PCT/EP2008/009829, International Search Report and Written Opinion mailed Feb. 3, 2009", 11 pgs.

"International Application No. PCT/EP2008/009830, International Search Report and Written Opinion mailed Jan. 20, 2009", 12 pgs.

Cattarin, S., et al., "Preparation and Characterization of Gold Nanostructures of Controlled Dimension by Electrochemical Techniques", *J. Phys. Chem. C*, 111(34), (2007), 12643-12649.

Erlebacher, J., et al., "Evolution of nanoporosity in dealloying.", *Nature*, 410(6827), (Mar. 22, 2001), 450-3.

Lu, X., et al., "Dealloying of Au-Ag thin films with a composition gradient: Influence on morphology of nanoporous Au", *Thin Solid Films*, 515(18), (Jun. 25, 2007), 7122-7126.

"International Application Serial No. PCT/EP2008/009829, English Translation of International Preliminary Report on Patentability issued Jun. 1, 2010", 6 pgs.

"International Application Serial No. PCT/EP2008/009829, International Preliminary Report on Patentability mailed May 27, 2010", 7pgs.

"U.S. Appl. No. 12/742,179, Response filed Jan. 29, 2013 to Restriction Requirement mailed Nov. 29, 2012", 9 pgs.

"U.S. Appl. No. 12/742,179, Response filed Aug. 27, 2012 to Restriction Requirement mailed Jul. 27, 2012", 12 pgs.

"U.S. Appl. No. 12/742,179, Restriction Requirement mailed Jul. 27, 2012", 7 pgs.

"U.S. Appl. No. 12/742,179, Restriction Requirement mailed Nov. 29, 2012", 7 pgs.

"U.S. Appl. No. 12/742,179, Non Final Office Action mailed Jul. 26, 2013", 19 pgs.

"U.S. Appl. No. 12/742,179, Response filed Oct. 28, 2013 to Non Final Office Action mailed Jul. 26, 2013", 23 pgs.

* cited by examiner a b c

METHOD FOR PRODUCING A NANOPOROUS LAYER

PRIORITY CLAIM TO RELATED APPLICATIONS

This application is a national stage application under 35 U.S.C. §371 of PCT/EP2008/009830, filed Nov. 14, 2008, and published as WO 2009/062754 A1 on May 22, 2009, which claims priority to German Application No. 10 2007 055 019.9, filed Nov. 14, 2007, which applications and publication are incorporated herein by reference and made a part hereof in their entirety, and the benefit of priority of each of which is claimed herein.

By way of example, but not by way of limitation, the invention relates to a method for producing a nanoporous layer, in particular for the modification of surfaces on microelectronic and micromechanical semiconductor wafers.

In semiconductor technology, nanoporous layers are used in more recent methods for connecting semiconductor components but also for the construction of semiconductors. In the course of the development of these layers, the different production technologies have been investigated. Methods such as sputtering or cathodic sputtering or vapour deposition are suitable for the production of thin layers up to 1 µm. Metallic layers of a few 10 µm are produced in microsystem technology preferably by galvanic deposition. In addition to pure metals, also various combinations of metal alloys can be deposited by means of these coating techniques. The layers are structured after a whole-surface deposition by a subsequent etching process or by the deposition in a prefabricated mask. The properties of such structures are determined by the solid properties of the metals or alloy, e.g. density, hardness, ductility, direct current conductivity, and the surface properties, e.g. adhesion, adsorption, corrosion, surface diffusion, alternating current conductivity.

To date, only smooth or rough surfaces have been able to be produced, the density not being able to be varied by the formation of cavities.

A method for producing Au sponges is known, in which an alloy of gold and silver was produced by liquid metallurgy. Subsequently, the silver was dissolved out by etching.

The object underlying the invention, by way of example, but not by way of limitation, can be to produce nanoporous, sponge-like layers on semiconductor materials and substrates for microelectronic, micromechanical and microoptical applications, which are simple in the production thereof and in which the density can be specifically varied.

This object can be achieved according to the invention, by way of example, but not by way of limitation, by the features of the main claim.

Advantageous developments and improvements are possible due to the measures indicated in the sub-claims.

As a result of the fact that a layer made of gold and silver is deposited on a substrate, the composition being in the range of 20% to 40% gold and 80% to 60% silver and as a result of the fact that silver is removed selectively, an Ag/Au layer can be produced in a simple deposition process, the silver being able to be removed likewise in normal processes, and a compressible layer with a high continuous pore proportion and a high freely accessible surface is achieved, said surface being able to be produced as functional layer on any substrates.

It is particularly advantageous to implement the deposition of the layer made of gold and silver by an electrochemical or galvanic route since, in contrast to the lift-off processes, the material consumption is less and hence costs and material are saved and in addition greater heights can be applied.

The density is dependent upon the composition of the silver/gold layer, in particular upon the proportional quantities of gold and silver. Deposition in thin-film technology, in comparison with liquid metallurgical process, allows the production of substantially thinner layers in the range of a few micrometers with simultaneously significantly less temperature stressing of the substrate, a multilayer construction by temporary masking and structuring of the nanoporous layer.

Advantageously, the silver can be dealloyed selectively by reverse electrolysis of the galvanic deposition principle. However, also selective dealloying by external currentless etching of the silver in suitable aqueous solutions is also possible. As a function of the type of dealloying and as a function of a subsequent tempering process, the pore size of the nanoporous gold layer can thereby be adjusted.

Figure 2:
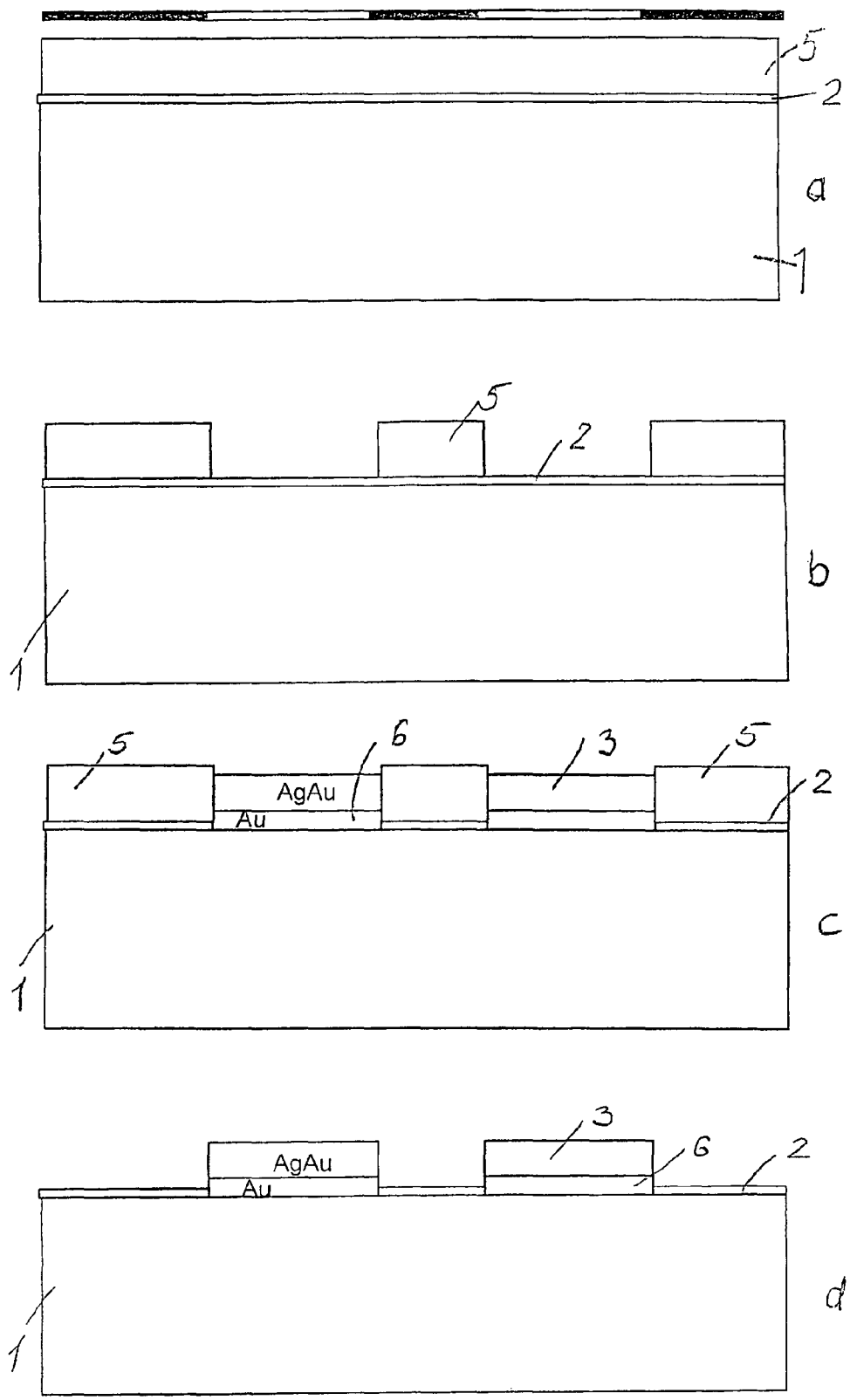
Figure 3:
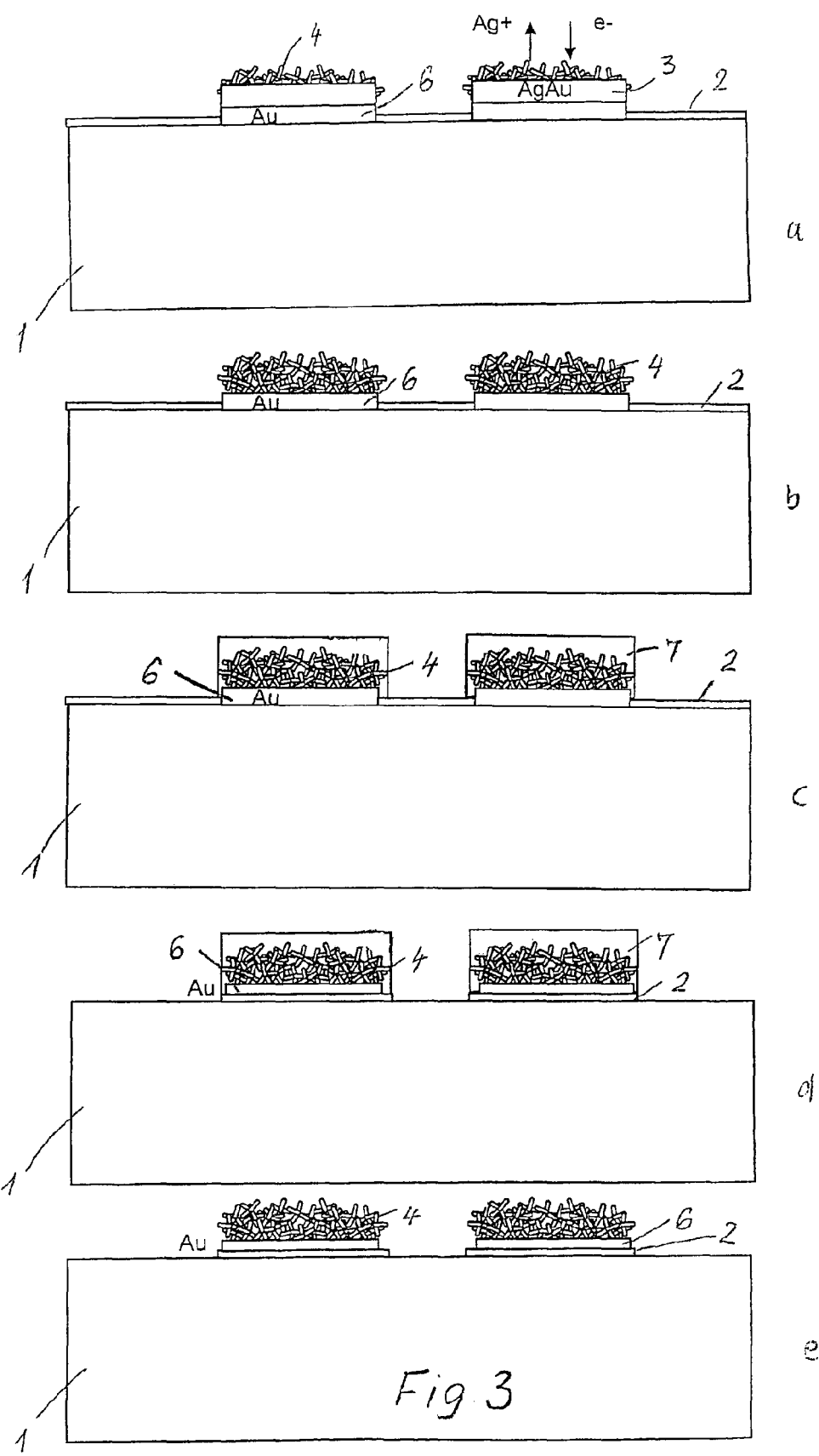
Figure 4:
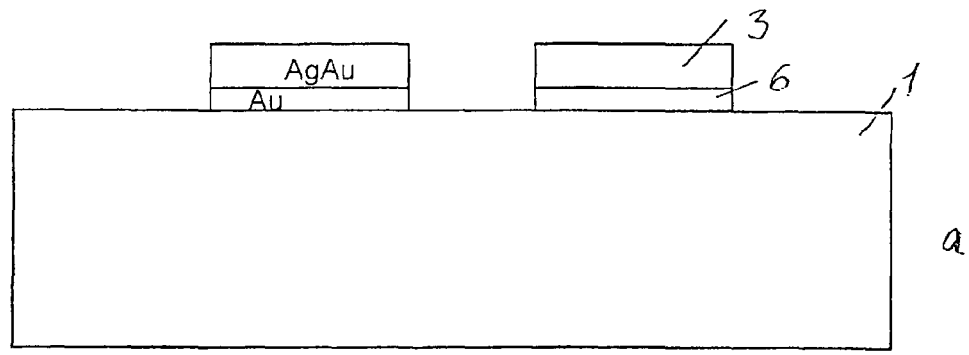
Figure 4:
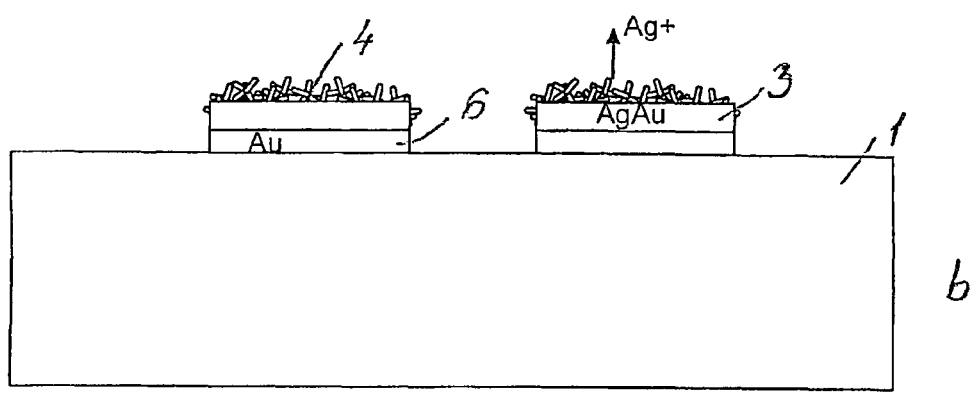
Figure 4:
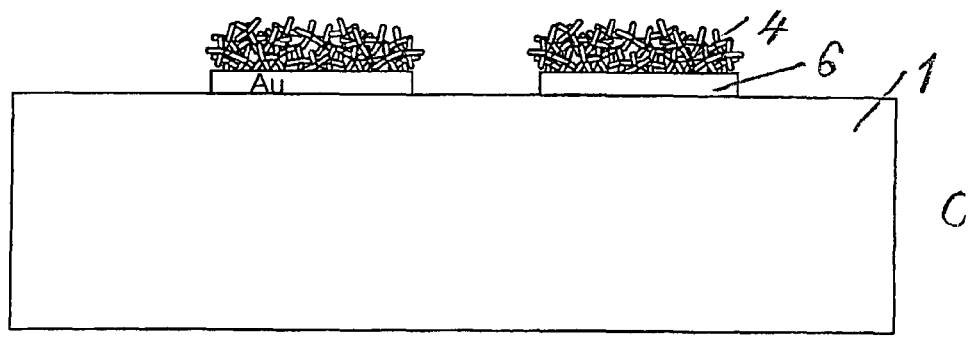
Figure 5:
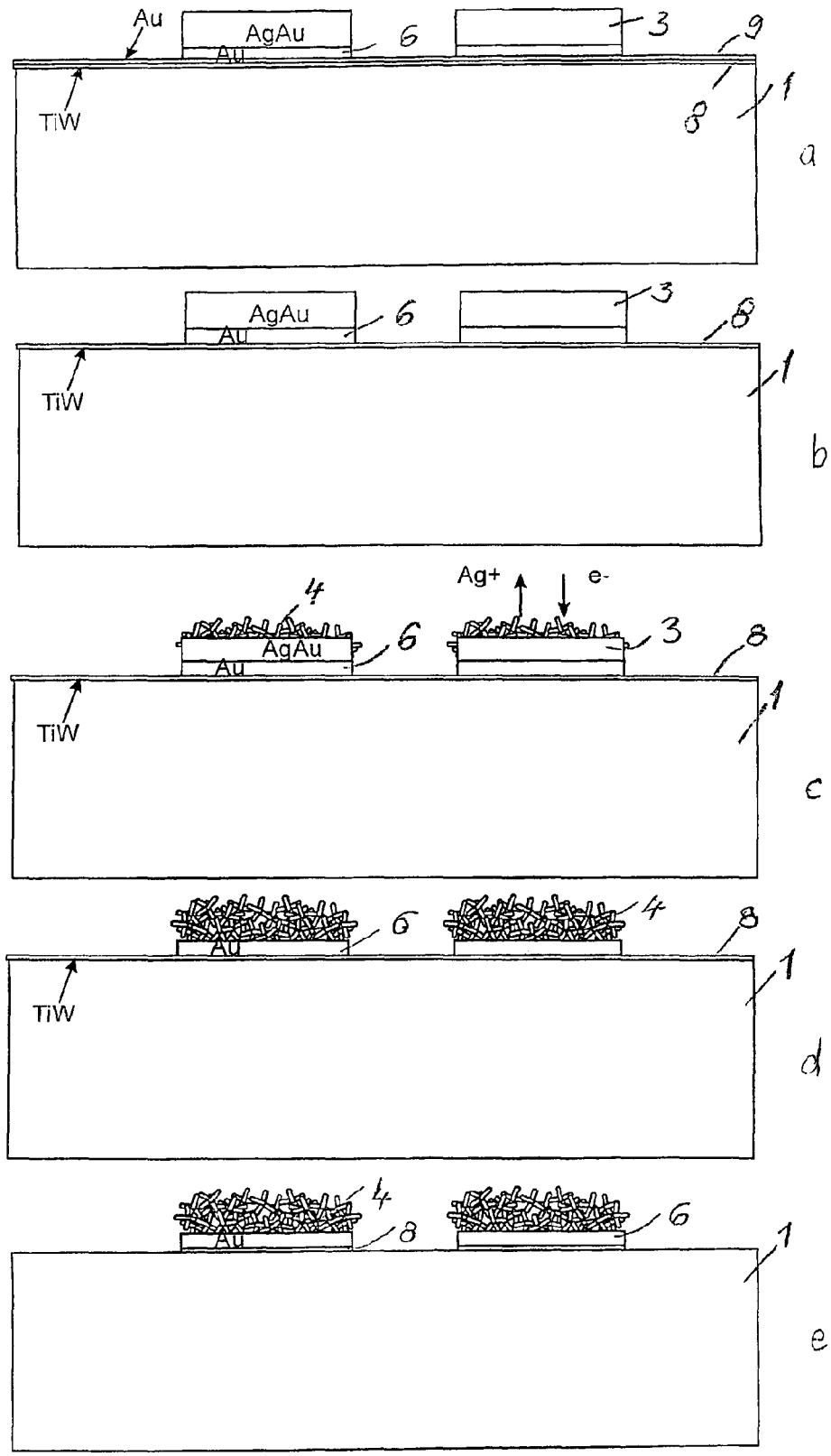

The method according to an illustrative embodiment of the invention is explained in more detail in the subsequent description using the accompanying drawing. There are shown:

FIG. 1 schematically, the layer construction in the case of different method steps according to the invention, FIG. 2 schematically, the layer construction in the case of further different method steps, FIG. 3 schematically, the layer construction in the case of method steps according to the invention for electrochemical etching, FIG. 4 schematically, the layer construction in the case of method steps according to the invention using external currentless etching processes and FIG. 5 schematically, the layer construction in the case of different method steps for a further variant for electrochemical etching.

In the following, the basic production steps of a nanoporous gold layer are intended to be described with reference to the Figures. First of all, corresponding to FIG. 1a, a plating base 2 in the form of a layer, for example made of titanium, titanium/tungsten or chromium for adhesion strengthening, is applied on the substrate and, thereupon, a starter layer made of gold, nickel, copper or platinum, this being able to take place by means of sputtering.

As further example of a step corresponding to FIG. 1b, a galvanic deposition of a gold/silver alloy is undertaken, the alloy-forming metallic elements being present firstly in an electrolyte, and the electrochemical deposition from the electrolyte takes place by applying a voltage. The composition of the gold/silver deposition is thereby in a range of 20% to 40% gold and 80% to 60% silver. As intermediate step corresponding to FIG. 1b, a gold/silver layer 3 is therefore situated on the starter layer 2.

Between FIG. 1b and the representation according to FIG. 1c in which a nanoporous gold layer 4 merging into the starter gold layer 2 is represented, the dissolving of the silver out of the layer 3 takes place, this selective dissolution or dealloying being able to be implemented in different ways. One possibility, in particular if electrochemical deposition is used, is reverse electrolysis of the principle of galvanic deposition in a suitable electrolyte in which a voltage is applied to the electrodes, by means of which the silver is dissolved out but the gold is not affected. Another possibility is selective dealloying by external currentless etching of the silver, e.g. in nitric acid-containing solutions.

In the process of dissolving out the silver, a surface reaction takes place in the Ag/Au layer 3, in which silver from the uppermost metal layer goes into solution as ion. The remaining Au atoms accumulate on the surface to form islands and protect the surface there selectively from further dissolution.

Subsequently, silver is dissolved out of the next metal layer which is not covered by a gold island.

By means of repeated accumulation of the moveable Au atoms from the layer, a 3D sponge layer with nanoscale pores grows slowly. The sponge-like nanoporous layer is designated in FIG. 1c with 4.

The deposition was described above by the electrochemical route, however the Ag/Au layer 3 can also be produced by vapour deposition, e.g. electron beam vapour deposition or sputtering. Similarly to FIG. 1a, an adhesive layer with materials generally used in thin-film technology is applied in advance. In the case of sputtering or cathodic sputtering, the silver and the gold can be sputtered alternately or in parallel, the multilayers diffusing into each other by means of tempering.

In the above description, only the main steps for producing the nanoporous layer 4 have been explained. Of course, further method steps are interposed.

Thus between the illustrations of FIG. 1a and 1b, a photosensitive lacquer 5 is applied corresponding to FIG. 2a and, corresponding to the specifications of the layer configuration, is structured lithographically (see FIG. 2b). Using the lacquer mask produced in this way, an additional intermediate layer 6 made of gold and the layer made of gold and silver is electroplated. The lacquer mask can be removed again, according to the method course, before (see FIG. 2d) or after the selective dealloying.

Further method courses are represented in FIGS. 3, 4, 5. Thus FIG. 3a shows, as already described above, the galvanic dissolution of the silver in an intermediate step and FIG. 3b the nanoporous sponge-like gold layer 4 on the further gold starter layer 6 and also the plating base 2.

If the complete plating base 2 is intended to be etched away, a second lacquer mask 7 is structured for protection of the nanoporous gold layer 4 (see FIG. 3c) and subsequently the plating base 2 is etched (see FIG. 3d). After removing this second lacquer mask 7 (FIG. 3e), the nanoporous layer 4 can be tempered in order to adjust the pore size. This pore size can be adjusted by different parameters, for example by the temperature or tempering time.

In a method step according to FIG. 4a, starting from the state according to FIG. 2d, the plating base 2 is removed before the dealloying of the silver from the gold/silver layer by etching in a suitable aqueous solution. Subsequently, according to FIG. 4b, the silver is removed by etching, e.g. in $HNO_3$, as a result of which the nanoporous gold layer 4 is produced (FIG. 4c).

If, according to FIG. 5a, a galvanic starter layer 9 made of gold is situated on an adhesive layer 8 made of titanium/tungsten, then an advantageous process sequence is provided if, after removing the lacquer mask 5 for protection (FIG. 2c), the galvanic starter layer made of gold is firstly removed. The remaining adhesive layer can subsequently be used as current-carrying layer for dealloying the silver (FIG. 5c, 5d). The subsequent removal of the adhesive layer can be effected in an aqueous solution without protection of the nanoporous gold structure by a second lacquer mask (FIG. 5e).

A large number of technical application fields is conceivable for the above-described nanoporous layer. The layers can be used in sensor technology for the most varied of purposes e.g. as filters, for surface enlargement, as biological interface and the like. Furthermore, such a layer can serve for adhesion improvement for further materials and for improved connection techniques, in particular also in microtechnology.

The nanoporous gold layer can be produced on semiconductor materials, for example on wafers with microelectronic circuits or micromechanical elements, it can be applied also on a circuit substrate, in particular on organic laminates, ceramic or glass.

The invention claimed is:

1. A method for producing a nanoporous layer, the method comprising:
    applying a plating base with adhesion strengthening onto a substrate;
    depositing a layer made of a gold and silver composition onto the substrate, the composition being in the range of 20% to 40% gold and 80% to 60% silver, and
    selectively removing the silver in order to produce a nanoporous gold layer.

2. The method according to claim 1, wherein the substrate comprises an already present metallic layer comprising gold.

3. The method according to claim 1, wherein the substrate comprises one or more semiconductor materials.

4. The method according to claim 1, wherein depositing the layer comprises galvanic or electrochemical deposition.

5. The method according to claim 1, wherein depositing the layer comprises vapour deposition or sputtering.

6. The method according to claim 1, comprising applying an adhesive layer.

7. The method according to claim 6, comprising lithographically structuring the adhesive layer.

8. The method according to claim 1, wherein selectively removing the silver includes reverse electrolysis of galvanic deposition.

9. The method according to claim 1, wherein selectively removing silver includes etching of the silver.

10. The method according to claim 1, comprising, before or after the removing the silver, removing a lacquer mask used for structuring the layer made of gold and silver.

11. The method according to claim 1, comprising structuring a mask for protection the nanoporous gold layer, etching the plating base, and removing the mask.

12. The method according to claim 1, comprising removing a galvanic starter layer after applying the layer and removing a lacquer mask, dealloying the silver, and removing an adhesive layer, without requiring masking of the nanoporous gold, in a suitable aqueous solution.

13. The method according to claim 1, comprising tempering the nanoporous gold layer to adjust pore size.

14. The method according to claim 1, wherein the substrate comprises a circuit substrate.

15. The method according to claim 1, comprising:
    applying a photosensitive lacquer and structuring the photosensitive lacquer in order to produce a lacquer mask,
    galvanic depositing the layer in an electrolyte by applying a voltage,
    selectively dealloying the silver,
    removing the lacquer mask before or after selectively dealloying the silver,
    structuring a second lacquer mask for protection of the nanoporous gold layer,
    etching the plating base, and
    removing the second lacquer mask.

16. The method according to claim 1, comprising lithographically structuring the plating base.

17. A method for producing a nanoporous layer, the method comprising:
    depositing a layer made of a gold and silver composition onto a substrate, the composition being in the range of 20% to 40% gold and 80% to 60% silver;
    selectively removing the silver in order to produce a nanoporous gold layer; and
    tempering the nanoporous gold layer to adjust pore size.

18. A method for producing a nanoporous layer, the method comprising:

depositing a layer made of a gold and silver composition onto a substrate, the composition being in the range of 20% to 40% gold and 80% to 60% silver;

applying of a plating base with adhesion strengthening onto the substrate, applying a photosensitive lacquer and structuring the photosensitive lacquer in order to produce a lacquer mask;

galvanic depositing the layer in an electrolyte by applying a voltage;

selectively dealloying the silver;

removing the lacquer mask before or after selectively dealloying the silver;

structuring a second lacquer mask for protecting the nanoporous gold layer;

etching the plating base; and removing the second lacquer mask.

\* \* \* \* \*

UNITED STATES PATENT AND TRADEMARK OFFICE
CERTIFICATE OF CORRECTION

| | | |
|---|---|---|
| PATENT NO. | : 8,673,773 B2 | Page 1 of 1 |
| APPLICATION NO. | : 12/743009 | |
| DATED | : March 18, 2014 | |
| INVENTOR(S) | : Oppermann et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 751 days.

Signed and Sealed this
Second Day of June, 2015

Michelle K. Lee
*Director of the United States Patent and Trademark Office*